US011257893B2

(12) United States Patent
Kim et al.

(10) Patent No.: US 11,257,893 B2
(45) Date of Patent: Feb. 22, 2022

(54) DISPLAY PANEL HAVING OPENING AREA AND METHOD OF MANUFACTURING THE SAME

(71) Applicant: Samsung Display Co., Ltd., Yongin-si (KR)

(72) Inventors: Junghwa Kim, Yongin-si (KR); Sewan Son, Yongin-si (KR); Minwoo Woo, Yongin-si (KR); Wangwoo Lee, Yongin-si (KR); Jihoon Kim, Yongin-si (KR); Byungseon An, Yongin-si (KR); Yonghui Lee, Yongin-si (KR); Kihyun Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 108 days.

(21) Appl. No.: 16/737,694

(22) Filed: Jan. 8, 2020

(65) Prior Publication Data

US 2020/0295112 A1 Sep. 17, 2020

(30) Foreign Application Priority Data

Mar. 15, 2019 (KR) ........................ 10-2019-0030021

(51) Int. Cl.
*H01L 27/32* (2006.01)
*H01L 51/00* (2006.01)
*H01L 51/52* (2006.01)
*H01L 51/56* (2006.01)

(52) U.S. Cl.
CPC ...... *H01L 27/3276* (2013.01); *H01L 51/0096* (2013.01); *H01L 51/5253* (2013.01); *H01L 51/56* (2013.01); *H01L 2227/323* (2013.01)

(58) Field of Classification Search
CPC ............ H01L 27/3276; H01L 51/0096; H01L 51/5253; H01L 51/56; H01L 2227/323
See application file for complete search history.

(56) References Cited

U.S. PATENT DOCUMENTS

| 8,465,992 B2 | 6/2013 | Kim et al. | |
| 8,917,516 B2 | 12/2014 | Kim | |
| 2015/0243722 A1* | 8/2015 | Kwon | H01L 27/3272 257/40 |
| 2017/0031323 A1* | 2/2017 | Kim | H01L 27/3258 |

(Continued)

FOREIGN PATENT DOCUMENTS

JP 6194233 B2 9/2017
KR 10-2012-0042151 A 5/2012

(Continued)

*Primary Examiner* — Lex H Malsawma
(74) *Attorney, Agent, or Firm* — Lewis Roca Rothgerber Christie LLP

(57) ABSTRACT

A display panel includes: a substrate including an opening area, a display area surrounding the opening area, and an intermediate area between the opening area and the display area; a plurality of display elements in the display area and electrically connected to a thin film transistor; a plurality of wirings arranged along an edge of the opening area in the intermediate area; and at least one metal pattern spaced apart from the plurality of wirings in the intermediate area, the at least one metal pattern surrounding the opening area and having a ring shape opened at one side.

20 Claims, 13 Drawing Sheets

(56) References Cited

U.S. PATENT DOCUMENTS

| | | |
|---|---|---|
| 2017/0173936 A1 | 6/2017 | Kawata et al. |
| 2018/0124898 A1 | 5/2018 | Kwon et al. |
| 2018/0331171 A1 | 11/2018 | Kim et al. |
| 2020/0110495 A1* | 4/2020 | Han .................. G06F 3/0412 |

FOREIGN PATENT DOCUMENTS

| | | |
|---|---|---|
| KR | 10-2017-0137230 A | 12/2017 |
| KR | 10-2018-0046960 A | 5/2018 |
| KR | 10-2018-0125084 A | 11/2018 |
| KR | 10-1935553 B1 | 1/2019 |

* cited by examiner

DISPLAY PANEL HAVING OPENING AREA AND METHOD OF MANUFACTURING THE SAME

CROSS-REFERENCE TO RELATED APPLICATION

This application claims priority to and the benefit of Korean Patent Application No. 10-2019-0030021, filed on Mar. 15, 2019, in the Korean Intellectual Property Office, the present disclosure of which is incorporated herein in its entirety by reference.

BACKGROUND

1. Field

Aspects of one or more example embodiments relate to a display panel and a method of manufacturing the display panel.

2. Description of the Related Art

Recently, applications of display devices have considerably diversified. Also, as display devices have become thinner and more lightweight, their range of use has gradually been extended.

As an area occupied by a display area of display devices increases, functions that may be combined or associated with the display device may be added. As a way of adding various functions while increasing an area, research into a display device in which various elements may be arranged is in progress.

The above information disclosed in this Background section is only for enhancement of understanding of the background and therefore it may contain information that does not constitute prior art.

SUMMARY

In the case of a display device having an opening, foreign substances such as moisture may permeate into the side surface of the opening, and in this case, display elements near the opening may be damaged. One or more example embodiments include a display panel having a structure capable of preventing or reducing moisture permeation through an opening, and a method of manufacturing the display panel, to reduce instances of various problems including the above-described problem. However, it should be understood that example embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more example embodiments, a display panel includes a substrate including an opening area, a display area surrounding the opening area, and an intermediate area between the opening area and the display area; a plurality of display elements arranged in the display area and electrically connected to a thin film transistor; a plurality of wirings arranged along an edge of the opening area in the intermediate area; and at least one metal pattern arranged to be spaced apart from the plurality of wirings in the intermediate area, the at least one metal pattern surrounding the opening area and having a ring shape opened at one side.

According to some example embodiments, the at least one metal pattern may include a first portion surrounding the opening area; a second portion extending from the first portion and bent toward the opening area; and a third portion extending from the second portion, the third portion having a length corresponding to a width of the second portion, which is greater than the width of the second portion.

According to some example embodiments, the at least one metal pattern may include a first portion surrounding the opening area; and a second portion extending from the first portion and bent toward the opening area, wherein the second portion may extend to an edge of a hole corresponding to the opening area.

According to some example embodiments, the at least one metal pattern may be arranged on a same layer as a source electrode and a drain electrode of the thin film transistor.

According to some example embodiments, the at least one metal pattern may be arranged on a same layer as a gate electrode of the thin film transistor.

According to some example embodiments, the display panel may further include a capacitor having a lower electrode arranged on a same layer as a gate electrode of the thin film transistor and an upper electrode at least partially overlapping the gate electrode with an insulating layer therebetween, wherein the at least one metal pattern may be arranged on a same layer as the upper electrode of the capacitor.

According to some example embodiments, each of the plurality of display elements may include a pixel electrode electrically connected to at least one of a source electrode and a drain electrode of the thin film transistor; an opposite electrode on the pixel electrode; and an emission layer arranged between the pixel electrode and the opposite electrode.

According to some example embodiments, the display panel may further include a functional layer between the pixel electrode and the emission layer, between the emission layer and the opposite electrode, or between the pixel electrode and the emission layer and between the emission layer and the opposite electrode, wherein each of the functional layer and the opposite electrode may be cut off around at least a portion of a surface of the at least one metal pattern.

According to some example embodiments, the display panel may further include an encapsulation layer covering the plurality of display elements, the encapsulation layer including a first inorganic encapsulation layer, a second inorganic encapsulation layer, and an organic encapsulation layer between the first inorganic encapsulation layer and the second inorganic encapsulation layer.

According to some example embodiments, the at least one metal pattern may include a first metal pattern arranged closer to the display area than the opening area; and a second metal pattern arranged between the first metal pattern and the opening area, wherein the first inorganic encapsulation layer and the organic encapsulation layer may be in contact with each other on the first metal pattern, and the first inorganic encapsulation layer and the second inorganic encapsulation layer may be in contact with each other on the second metal pattern.

According to one or more example embodiments, a method of manufacturing a display panel includes forming at least one metal pattern in an intermediate area of a substrate including an opening area, a display area surrounding the opening area, and the intermediate area between the opening area and the display area, the at least one metal pattern surrounding the opening area and having a ring shape opened at one side; forming a pixel electrode in the display area; forming a lift-off pattern on the at least one metal pattern, the lift-off pattern being in contact with the at least one metal pattern and having a negative thermal expansion coefficient; sequentially forming an emission layer and an opposite electrode to cover the pixel electrode and the lift-off pattern; and separating portions of the emission layer and the opposite electrode from the substrate together with the lift-off pattern by applying current to both ends of the at least one metal pattern and heating the at least one metal pattern.

According to some example embodiments, the method may further include forming a thin film transistor electrically connected to the pixel electrode in the display area.

According to some example embodiments, the at least one metal pattern may be arranged on a same layer as a source electrode and a drain electrode of the thin film transistor.

According to some example embodiments, the at least one metal pattern may be arranged on a same layer as a gate electrode of the thin film transistor.

According to some example embodiments, the method may further include forming a capacitor having a lower electrode arranged on a same layer as a gate electrode of the thin film transistor and an upper electrode at least partially overlapping the gate electrode with an insulating layer therebetween, wherein the at least one metal pattern may be arranged on a same layer as the upper electrode of the capacitor.

According to some example embodiments, the lift-off pattern may include at least one of polyolefin, acryl-based polymer, and polyester.

According to some example embodiments, the separating of the portions of the emission layer and the opposite electrode may include heating the at least one metal pattern at a temperature of about 100° C. to about 150° C.

According to some example embodiments, the method may further include forming an encapsulation layer on the opposite electrode, the encapsulation layer including a first inorganic encapsulation layer, a second inorganic encapsulation layer, and an organic encapsulation layer between the first inorganic encapsulation layer and the second inorganic encapsulation layer.

According to some example embodiments, the forming of the at least one metal pattern may include forming a first metal pattern closer to the display area than the opening area; and forming a second metal pattern of which at least a portion is located between the first metal pattern and the opening area, wherein the first inorganic encapsulation layer and the organic encapsulation layer may be in contact with each other on the first metal pattern, and the first inorganic encapsulation layer and the second inorganic encapsulation layer may be in contact with each other on the second metal pattern.

According to some example embodiments, the method may further include forming a hole corresponding to the opening area, wherein an end portion of the second metal pattern is cut along an edge of the hole.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
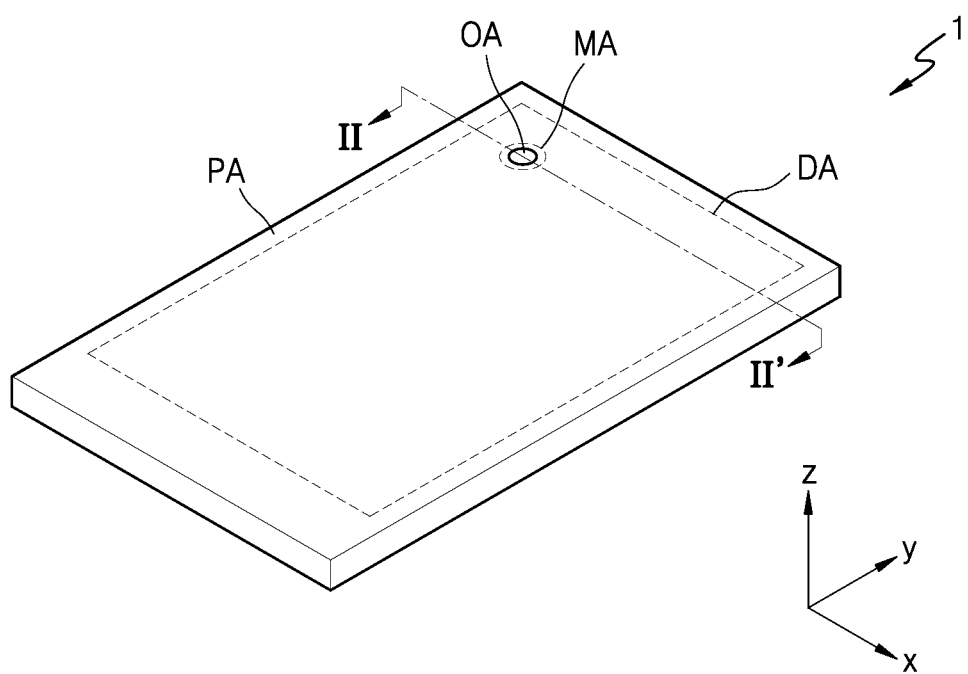
FIG. 1 is a perspective view of a display device according to some example embodiments.

Reference will now be made in more detail to example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of" when preceding a list of elements, modify the entire list of elements and do not modify the individual elements of the list.

As the present disclosure allows for various changes and numerous embodiments, example embodiments will be illustrated in the drawings and described in more detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of the related art are omitted when it is deemed that they may unnecessarily obscure the essence of the present disclosure.

While such terms as "first," "second," etc., may be used to describe various components, such components must not be limited to the above terms. The above terms are used only to distinguish one component from another.

It will be understood that when a layer, film, region, plate, or component is referred to as being "formed on" another layer, film, region, plate, or component, it can be directly or indirectly formed on the other layer, film, region, plate, or component. That is, for example, intervening layers, films, regions, plates, or components may be present.

In the following examples, the x-axis, the y-axis and the z-axis are not limited to the three axes of the rectangular coordinate system, and may be interpreted in a broader sense. For example, the x-axis, the y-axis, and the z-axis may be perpendicular to one another, or may represent different directions that are not perpendicular to one another.

Hereinafter, aspects of some example embodiments are described with reference to the drawings. In making description with reference to the drawings, like reference numerals are used for substantially like or corresponding elements and repeated descriptions thereof are omitted. In the drawings, a thickness is enlarged so as to clearly express a plurality of layers and areas. Also, in the drawings, thicknesses of some layers and areas may be exaggerated for convenience of explanation.

Figure 2:
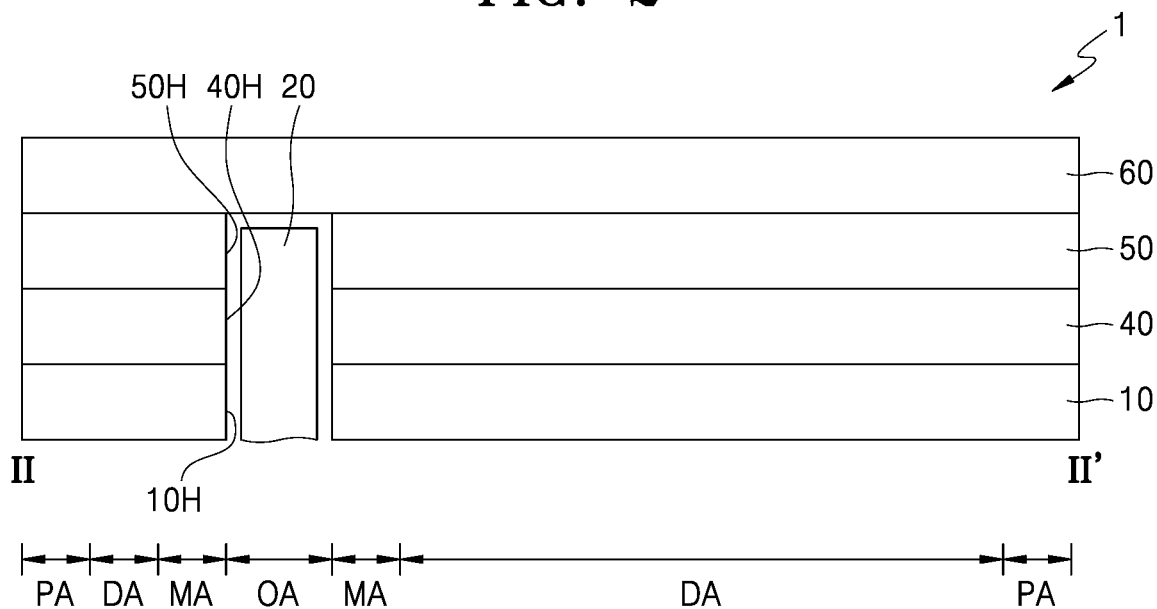
FIG. 2 is a cross-sectional view of the display device, taken along the line II-II' of FIG. 1.

FIG. 1 is a perspective view of a display device 1 according to some example embodiments, and FIG. 2 is a cross-sectional view of the display device 1, taken along the line II-II' of FIG. 1.

Referring to FIG. 1, the display device 1 includes an opening area OA, which is a first area, and a display area DA, which is a second area that at least partially surrounds the opening area OA. The display device 1 may provide an image by using light emitted from a plurality of pixels arranged in the display area DA. It is shown in FIG. 1 that one opening area OA is arranged inside the display area DA, and the opening area OA may be entirely surrounded by the display area DA. The opening area OA may be an area in which a component to be described below with reference to FIG. 2 is arranged.

An intermediate area MA, which is a third area, may be arranged between the opening area OA and the display area DA, and the display area DA may be surrounded by an outer area PA, which is a fourth area. The intermediate area MA and the outer area PA may be a kind of non-display areas in which pixels are not arranged. The intermediate area MA may be entirely surrounded by the display area DA, and the display area DA may be entirely surrounded by the outer area PA.

Although an organic light-emitting display device is described as an example of the display device 1 according to some example embodiments below, the display device 1 is not limited thereto. According to some example embodiments, various types of display devices such as an inorganic light-emitting display and a quantum dot light-emitting display may be used.

Although it is shown in FIG. 1 that one opening area OA is provided and is approximately circular, embodiments according to the present disclosure are not limited thereto. The number of opening areas OA may be two or more, and a shape of each of the opening areas OA may be a circular shape, an elliptical shape, a polygonal shape, a star shape, a diamond shape, or the like and may be variously modified.

Referring to FIG. 2, the display device 1 may include a display panel 10, and an input sensing layer 40 and an optical functional layer 50 arranged on the display panel 10. These layers may be covered by a window 60. The display device 1 may include various electronic devices such as mobile phones, notebook computers, and smartwatches.

The display panel 10 may display an image. The display panel 10 includes pixels arranged in the display area DA. Each of the pixels may include a display element and a pixel circuit connected thereto. The display element may include an organic light-emitting diode, an inorganic light-emitting diode, a quantum dot light-emitting diode, or the like.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual cap method and/or a self cap method.

The input sensing layer 40 may be directly formed on the display panel 10 or may be formed separately and then coupled by using an adhesive layer such as an optical clear adhesive (OCA). For example, the input sensing layer 40 may be successively formed after a process of forming the display panel 10. In this case, the adhesive layer may not be arranged between the input sensing layer 40 and the display panel 10. Although FIG. 2 shows that the input sensing layer 40 is arranged between the display panel 10 and the optical functional layer 50, the input sensing layer 40 may be arranged on the optical functional layer 50 according to some example embodiments.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may include a film-type retarder or a liquid crystal coating-type retarder. The retarder may include a $\lambda/2$ retarder and/or a $\lambda/4$ retarder. The polarizer may include a film-type polarizer or a liquid crystal coating-type polarizer. The film-type polarizer may include a stretchable synthetic resin film, and the liquid crystal coating-type polarizer may include liquid crystals arranged in a predetermined arrangement. Each of the retarder and the polarizer may further include a protective film. The retarder and the polarizer themselves or their protective films may be defined as a base layer of the reflection prevention layer.

According to some example embodiments, the reflection prevention layer may include a black matrix and color filters. The color filters may be arranged by taking into account colors of light emitted respectively from pixels of the display panel 10. According to some example embodiments, the reflection prevention layer may include a destructive interference structure. The destructive interference structure may include a first reflection layer and a second reflection layer respectively arranged in different layers. First reflected light and second reflected light respectively reflected by the first reflection layer and the second reflection layer may create destructive-interference and thus reflectivity of external light may be reduced.

The optical functional layer 50 may include a lens layer. The lens layer may improve emission efficiency of light emitted from the display panel 10 or reduce color deviation of the light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

The display panel 10, the input sensing layer 40, and/or the optical functional layer 50 may include an opening. With regard to this, FIG. 2 shows that the display panel 10, the input sensing layer 40, and the optical functional layer 50 respectively include first to third openings 10H, 40H, and 50H and that the first to third openings 10H, 40H, and 50H thereof overlap each other. The first to third openings 10H, 40H, and 50H are located to correspond to the opening area OA. According to some example embodiments, at least one of the display panel 10, the input sensing layer 40, and the optical functional layer 50 may not include an opening. For example, one or two of the display panel 10, the input sensing layer 40, and the optical functional layer 50 may not include an opening. Alternatively, the display panel 10, the input sensing layer 40, and the optical functional layer 50 may not include an opening.

As described above, the opening area OA may be a kind of component area (e.g., a sensor area, a camera area, a speaker area, etc.) in which a component 20 for adding various functions to the display device 1 is located. As shown in FIG. 2, the component 20 may be located in the first to third openings 10H, 40H, and 50H. However, embodiments according to the present disclosure are not limited thereto and the component 20 may be arranged below the display panel 10.

The component 20 may include an electronic element. For example, the component 20 may include an electronic element that uses light or sounds. For example, an electronic element may be a sensor such as an infrared sensor that emits and/or receives light, a camera that receives light and captures an image, a sensor that outputs and senses light or sounds to measure a distance or recognize a fingerprint, a small lamp that outputs light, or a speaker that outputs sounds. An electronic element that uses light may use light in various wavelength bands such as visible light, infrared light, and ultraviolet light. According to some example embodiments, the opening area OA may be understood as a transmission area through which light and/or sound, which are output from the component 20 to the outside or propagate toward the electronic element from the outside, may pass.

According to some example embodiments, in the case where the display device 1 is used as a smartwatch or an instrument panel for an automobile, the component 20 may be a member including a needle of a clock or a needle, etc. indicating predetermined information (e.g. the velocity of a vehicle, etc.). In the case where the display device 1 includes a needle of a clock or an instrument panel for an automobile, the component 20 may be exposed to the outside through the window 60, which may include an opening corresponding to the opening area OA.

As described above, the component 20 may include element(s) related to a function of the display panel 10 or an element such as an accessory that increases an esthetic sense of the display panel 10. According to some example embodiments, a layer including an OCA, etc. may be located between the window 60 and the optical functional layer 50.

Figure 3:
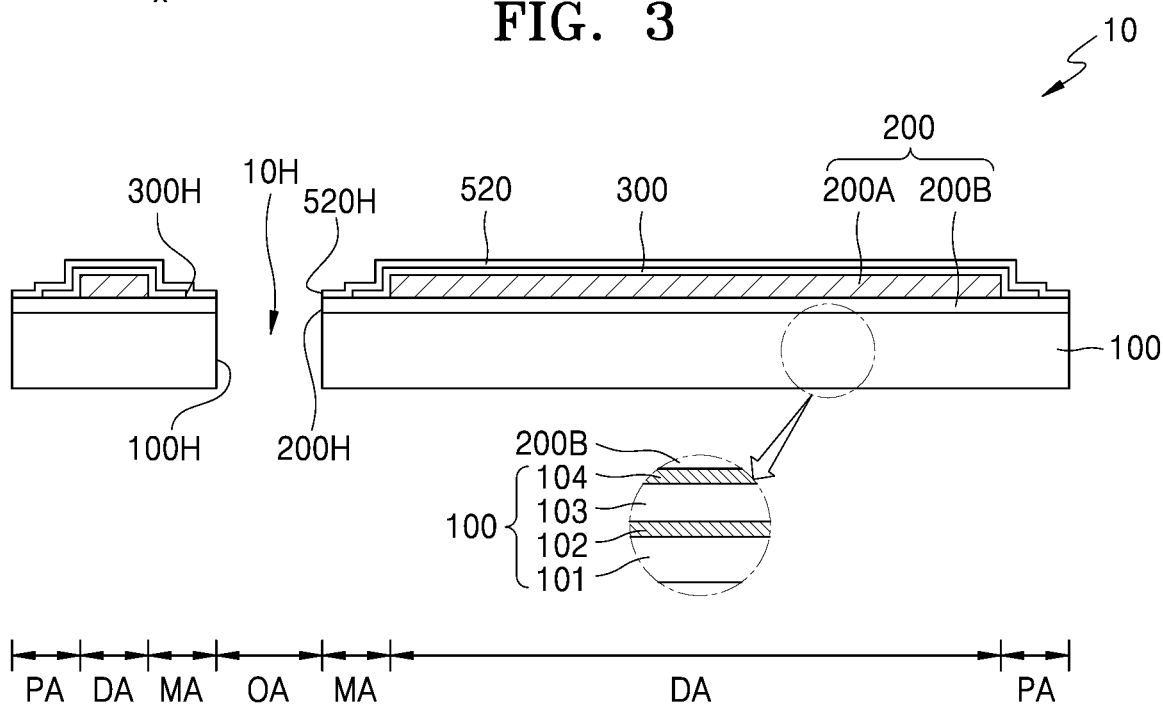
FIG. 3 is a cross-sectional view of a display panel according to some example embodiments.

FIG. 3 is a cross-sectional view of a display panel 10 according to some example embodiments.

Referring to FIG. 3, the display panel 10 includes a display layer 200 arranged on a substrate 100. The substrate 100 may include a glass material or a polymer resin. The substrate 100 may include a multi-layer. For example, as shown in an enlarged view of FIG. 3, the substrate 100 may include a first base layer 101, a first barrier layer 102, a second base layer 103, and a second barrier layer 104.

Each of the first and second base layers 101 and 103 may include a polymer resin. For example, the first and second base layers 101 and 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyacrylate, polyimide (PI), polycarbonate (PC), cellulose triacetate (TAC), or cellulose acetate propionate (CAP). The polymer resin may be transparent.

Each of the first and second barrier layers 102 and 104 may include a barrier layer configured to prevent permeation of external foreign substances and include a single layer or a multi-layer including an inorganic material such as SiNx and/or SiOx.

The display layer 200 includes a plurality of pixels. The display layer 200 may include a display element layer 200A including a display element arranged in each pixel, and a pixel circuit layer 200B including a pixel circuit and insulating layers arranged in each pixel. Each pixel circuit may include a thin film transistor and a storage capacitor. Each display element may include an organic light-emitting diode OLED.

Display elements of the display layer 200 may be covered by an encapsulation member such as an encapsulation layer 300, and an inorganic layer 520 is arranged on the encapsulation layer 300. The inorganic layer 520 may cover ends of the encapsulation layer 300 in an intermediate area MA. The inorganic layer 520 may further extend toward an opening area OA than an end of the encapsulation layer 300 in the intermediate area MA and contact a layer arranged under the end of the encapsulation layer 300. The inorganic layer 520 may include an inorganic insulating material, and the inorganic insulating material may include, for example, silicon nitride, silicon oxide, and silicon oxynitride.

In the case where the display panel 10 includes the substrate 100 and the encapsulation layer 300, each being a multi-layer, the flexibility of the display panel 10 may be improved. The display panel 10 may include a first opening 10H that passes through the display panel 10. The first opening 10H may be located in the opening area OA, and in this case, the opening area OA may be a kind of opening area.

It is shown in FIG. 3 that the substrate 100, the encapsulation layer 300, and the inorganic layer 520 respectively include through holes 100H, 300H, and 520H, each corresponding to the first opening 10H. The display layer 200 may include a through hole 200H corresponding to the opening area OA.

According to some example embodiments, the substrate 100 may not include a through hole corresponding to the opening area OA. In this case, the encapsulation layer 300 may include the through hole 300H corresponding to the opening area OA. The inorganic layer 520 may include the through hole 520H corresponding to the opening area OA, or may cover the opening area OA while not including a through hole.

Although it is shown in FIG. 3 that a display element layer is not arranged in the opening area OA, the present disclosure is not limited thereto. According to some example embodiments, an auxiliary display element layer may be located in the opening area OA, and in this case, the auxiliary display element layer may have the same structure and/or operation way as a display element of the display element layer 200A, or may have a different structure and/or operation way from the display element of the display element layer 200A.

Figure 4:
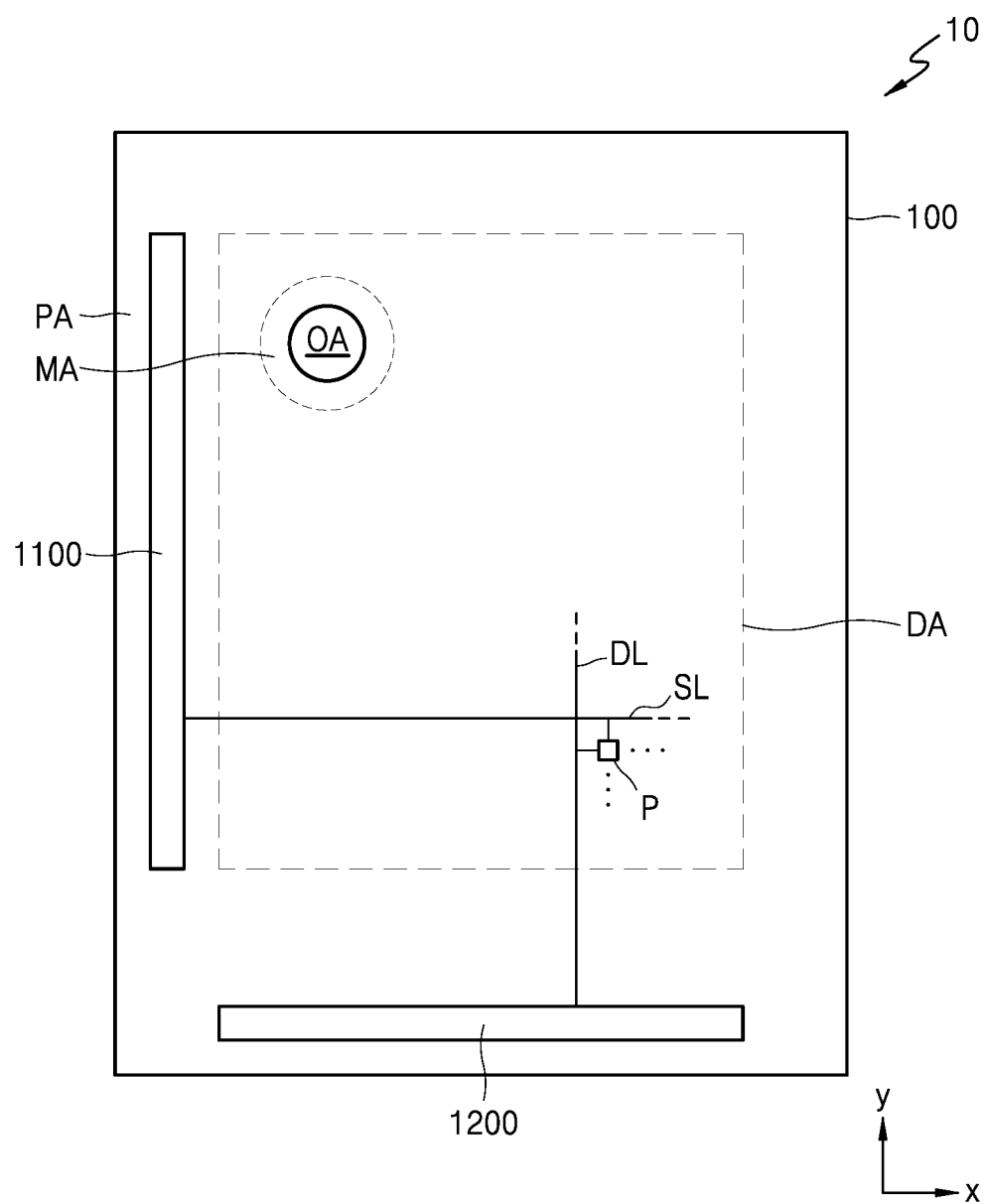
FIG. 4 is a plan view of a display panel according to some example embodiments.
Figure 5:
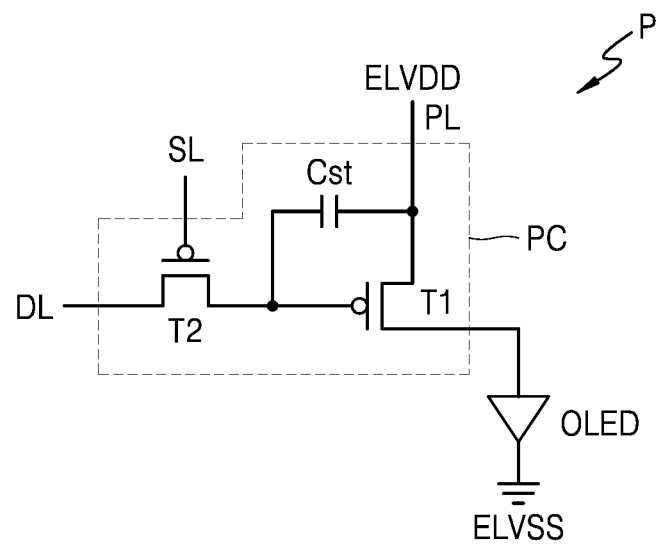
FIG. 5 is an equivalent circuit diagram of one pixel of a display panel according to some example embodiments.

FIG. 4 is a plan view of a display panel 10 according to some example embodiments, and FIG. 5 is an equivalent circuit diagram of one pixel of the display panel 10 according to some example embodiments.

Referring to FIG. 4, the display panel 10 may include a display area DA, an opening area OA, an intermediate area MA, and an outer area PA. FIG. 4 may be understood as a figure of a substrate 100 of the display panel 10. For example, the substrate 100 may be understood to include the display area DA, the opening area OA, the intermediate area MA, and the outer area PA.

The display panel 10 includes a plurality of pixels P arranged in the display area DA. As shown in FIG. 5, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, or blue light, or red, green, blue, or white light through the organic light-emitting diode OLED.

The second thin film transistor T2 is a switching thin film transistor and is connected to a scan line SL and a data line DL, and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined brightness by using the driving current. An opposite electrode (e.g. a cathode) of the organic light-emitting diode OLED may receive a second power voltage ELVSS.

Although it is shown in FIG. 5 that the pixel circuit PC includes two thin film transistors and one storage capacitor, the present disclosure is not limited thereto. The number of thin film transistors and the number of storage capacitors may be variously modified depending on a design of the pixel circuit PC.

Referring to FIG. 4 again, the intermediate area MA may surround the opening area OA. The intermediate area MA is an area in which a display element such as the organic light-emitting diode OLED is not arranged, and signal lines configured to provide a signal to pixels P arranged around the opening area OA may pass across the intermediate area MA. A scan driver 1100 configured to provide a scan signal to each pixel P, a data driver 1200 configured to provide a data signal to each pixel P, main power wirings configured to provide first and second power voltages, etc. may be arranged in the outer area PA. Although it is shown in FIG. 4 that the data driver 1200 is adjacent to one side of the substrate 100, the data driver 1200 may be arranged on a flexible printed circuit board (FPCB) electrically connected to a pad arranged on one side of the display panel 10.

Figure 6:
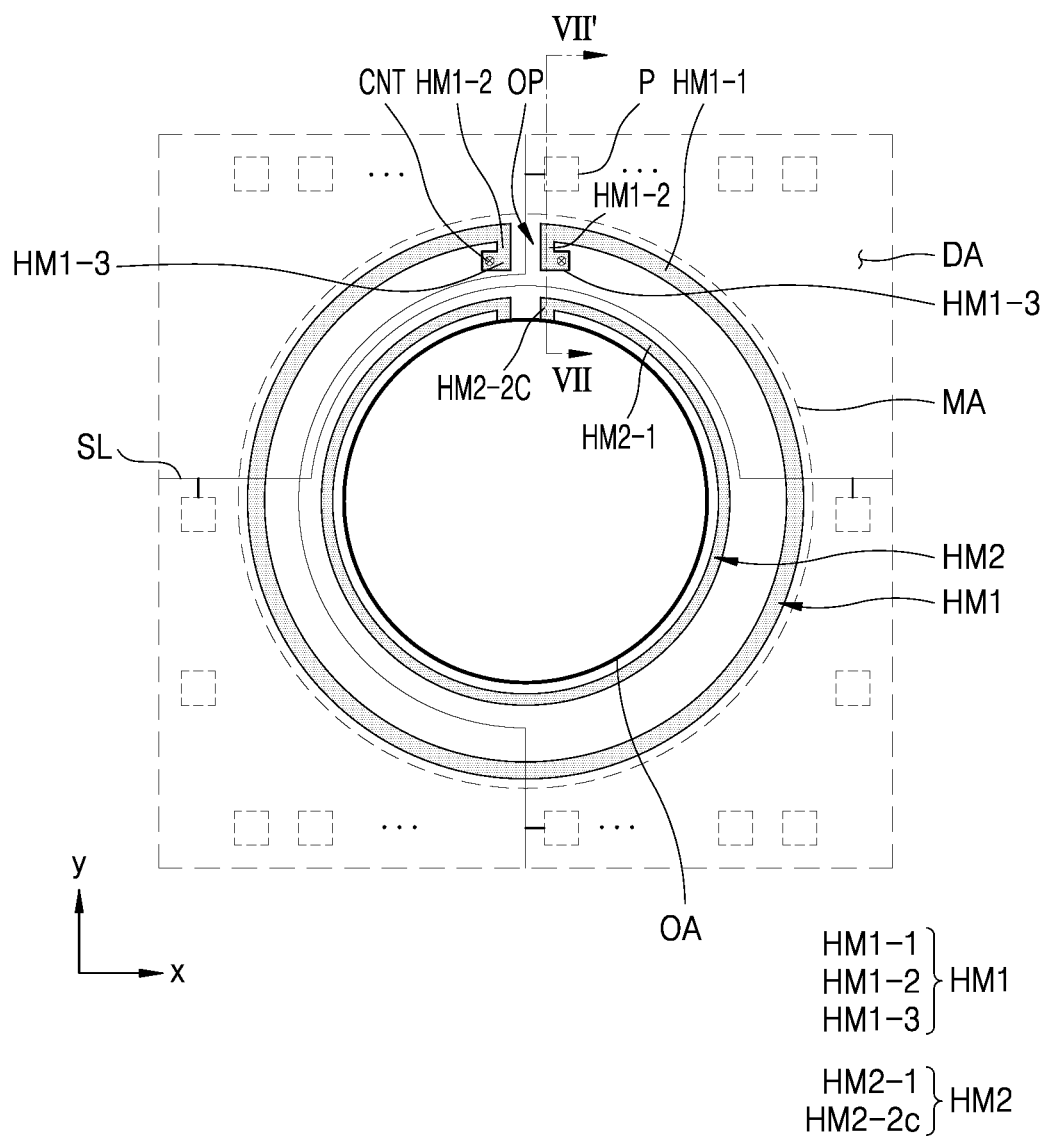
FIG. 6 is a plan view of a portion of a display panel according to some example embodiments.

FIG. 6 is a plan view of a portion of a display panel according to some example embodiments.

Referring to FIG. 6, pixels P are arranged around an opening area OA in a display area DA. The pixels P may be spaced apart from each other around the opening area OA. In a plan view, the pixels P may be arranged on upper, lower, left, and right sides with respect to the opening area OA.

Signal lines adjacent to the opening area OA from among signal lines supplying signals to the pixels P may detour around the opening area OA. In the plan view of FIG. 6, some of the data lines DL that pass across the display area DA may extend in a y-direction to provide a data signal to pixels P arranged above and below the opening area OA and may detour along the edge of the opening area OA in the intermediate area MA. In the plan view, some of the scan lines SL that pass across the display area DA may extend in an x-direction to provide a scan signal to pixels P respectively arranged on the left and right sides of the opening area OA and may detour along the edge of the opening area OA in the intermediate area MA. In FIG. 6, an area curved along the edge of the opening area OA correspond to a detour portion of a scan line SL and a detour portion of a data line DL, respectively. The detour portion of the scan line SL and/or the detour portion of the data line DL may be integrally formed on the same layer as an extending portion across the display area DA. According to some example embodiments, the detour portion of the scan line SL or/and the detour portion of the data line DL may be formed on a different layer from the extending portion across the display area DA and electrically connected to the extending portion via a contract hole.

At least one metal pattern HM1 and HM2 is arranged in the intermediate area MA to be spaced apart from the scan and data lines SL and DL described above. The at least one metal pattern HM1 and HM2 surrounds the opening area OA and has a substantially ring shape. In this case, the ring shape may correspond to an edge shape of the opening area OA, but may be different from the edge shape of the opening area OA. The ring shape is not limited to a circular shape, and may be variously changed into an elliptical shape, a polygonal shape, or the like.

The ring shape is a shape in which one side is opened, and thus, both side ends of the at least one metal pattern HM1 and HM2 may be spaced apart from each other to form an opening OP.

According to some example embodiments, the at least one metal pattern HM1 and HM2 may include a first metal pattern HM1 and a second metal pattern HM2. The first metal pattern HM1 is located next to the display area DA to be closer to the display area DA than to the opening area OA. The second metal pattern HM2 is a pattern arranged between the first metal pattern HM1 and the opening area OA and is located closer to the opening area OA than to the display area DA.

For example, as shown in FIG. 6, the first metal pattern HM1 may be arranged between the detour portions of the scan and data lines SL and DL described above and the display area DA.

According to some example embodiments, the first metal pattern HM1 may include a first portion HM1-1, a second portion HM1-2, and a third portion HM1-3. The first portion HM1-1 is a portion surrounding the opening area OA and denotes a curved portion having a ring shape. In this case, the first portion HM1-1 may have a shape corresponding to detour portions of at least some of the scan and data lines SL and DL described above.

The second portion HM1-2 may be a portion extending from the first portion HM1-1 and bent toward the opening area OA. In this case, the second portion HM1-2 may be linear unlike the first portion HM1-1 and, according to some example embodiments, the second portion HM1-2 may extend in they direction which is an extending direction of the data line DL in the display area DA. The opening OP of the first metal pattern HM1 described above may be a space between a second portion HM1-2, which is a side end portion of the first metal pattern HM1, and a second portion HM1-2, which is an opposite side end portion of the first metal pattern HM1.

The third portion HM1-3 may be an end portion of the first metal pattern HM1 extending from the second portion HM1-2. In this case, the length of the third portion HM1-3 defined in the x direction may be greater than the width of the second portion HM1-2 defined in the x direction. Specifically, the third portion HM1-3 may be a portion extending from the second portion HM1-2 and bent toward the outside of the opening OP. The third portion HM1-3 may be larger in size or larger in area than the second portion HM1-2. This is for the electrical connection of the first metal pattern HM1 to an external power source through the third portion HM1-3, and a current applied from the external power source may flow through the first and second portions HM1-1 and HM1-2 of the first metal pattern HM1 by increasing the width, size or area of the third portion HM1-2.

Accordingly, the third portion HM1-3 may be provided with a contact portion CNT for contacting a probe or the like for supplying external power.

The second metal pattern HM2 may be arranged between the detour portions of the scan and data lines SL and DL and the opening area OA, as shown in FIG. 6.

According to some example embodiments, the second metal pattern HM2 may include a first portion HM2-1 and a second portion HM2-2C. The first portion HM2-1 of the second metal pattern HM2 may be a curved portion having a ring shape surrounding the opening area OA, like the first portion HM1-1 of the first metal pattern HM1. Therefore, the first portion HM2-1 may also have a shape corresponding to the detour portions of at least some of the scan and data lines SL and DL described above.

The second portion HM2-2C of the second metal pattern HM2 may be a portion extending from the first portion HM2-1 of the second metal pattern HM2 and bent toward the opening area OA, like the second portion HM1-2 of the first metal pattern HM1. In this case, the second portion HM2-2C may be linear unlike the first portion HM2-1 and, according to some example embodiments, the second portion HM2-2C may extend in the y direction which is an extending direction of the data line DL in the display area DA. The second metal pattern HM2 may have an opening defined as a space between second portions HM2-2C located at both side ends of the second metal pattern HM2 like the first metal pattern HM1.

However, unlike the first metal pattern HM1, the second metal pattern HM2 may not have a portion corresponding to the third portion HM1-3 of the first metal pattern HM1 and may extend to the edge of the opening area OA. Thus, the second portion HM2-2C of the second metal pattern HM2 may be an end portion of the second metal pattern HM2.

Hereinafter, with reference to FIGS. 7A to 7C, the positions of the at least one metal patterns HM1 and HM2 are described in detail.

Figure 7A:
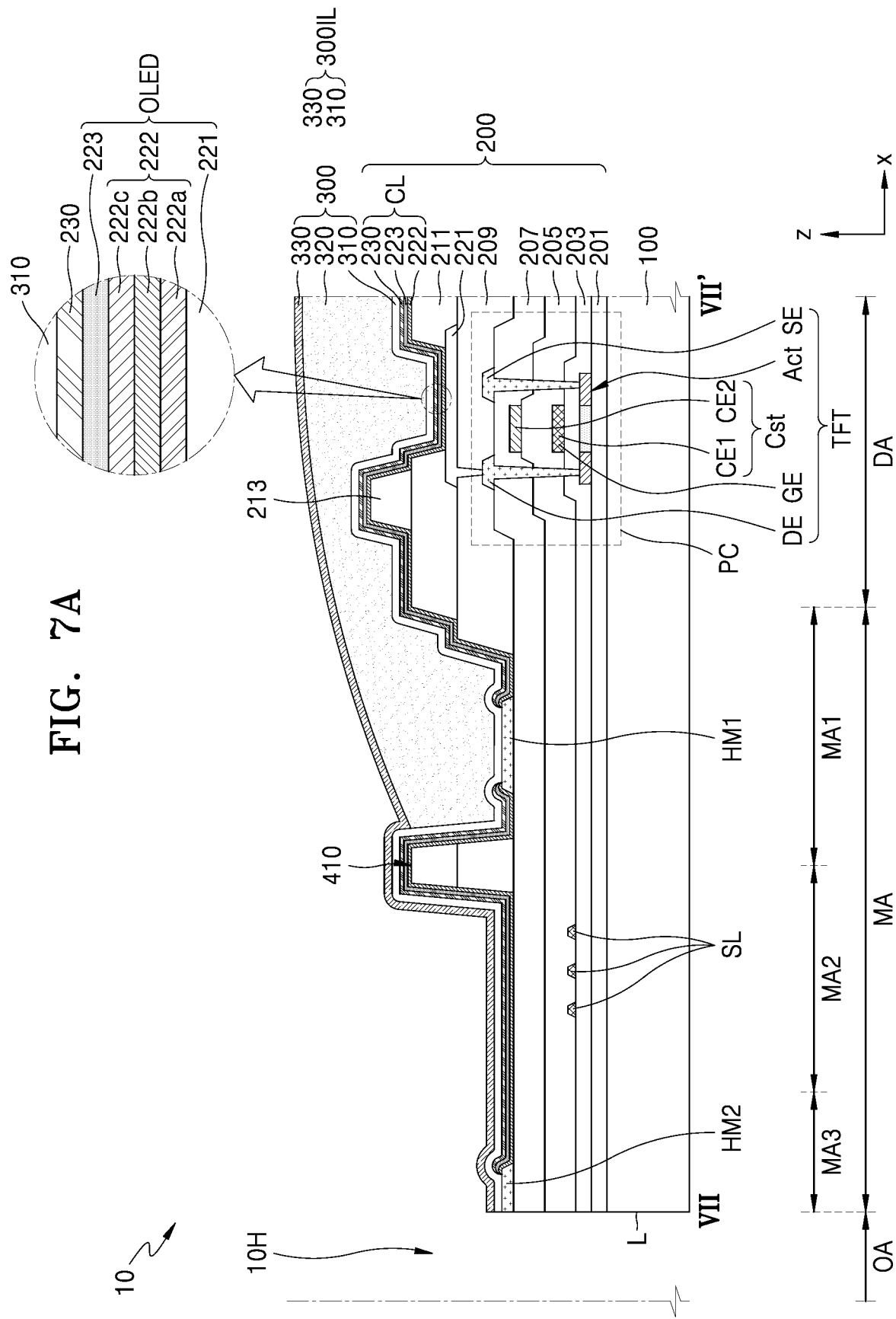
FIGS. 7A to 7C are examples of a cross-sectional view taken along the line VII-VII' of the display panel of FIG. 6.
Figure 7B:
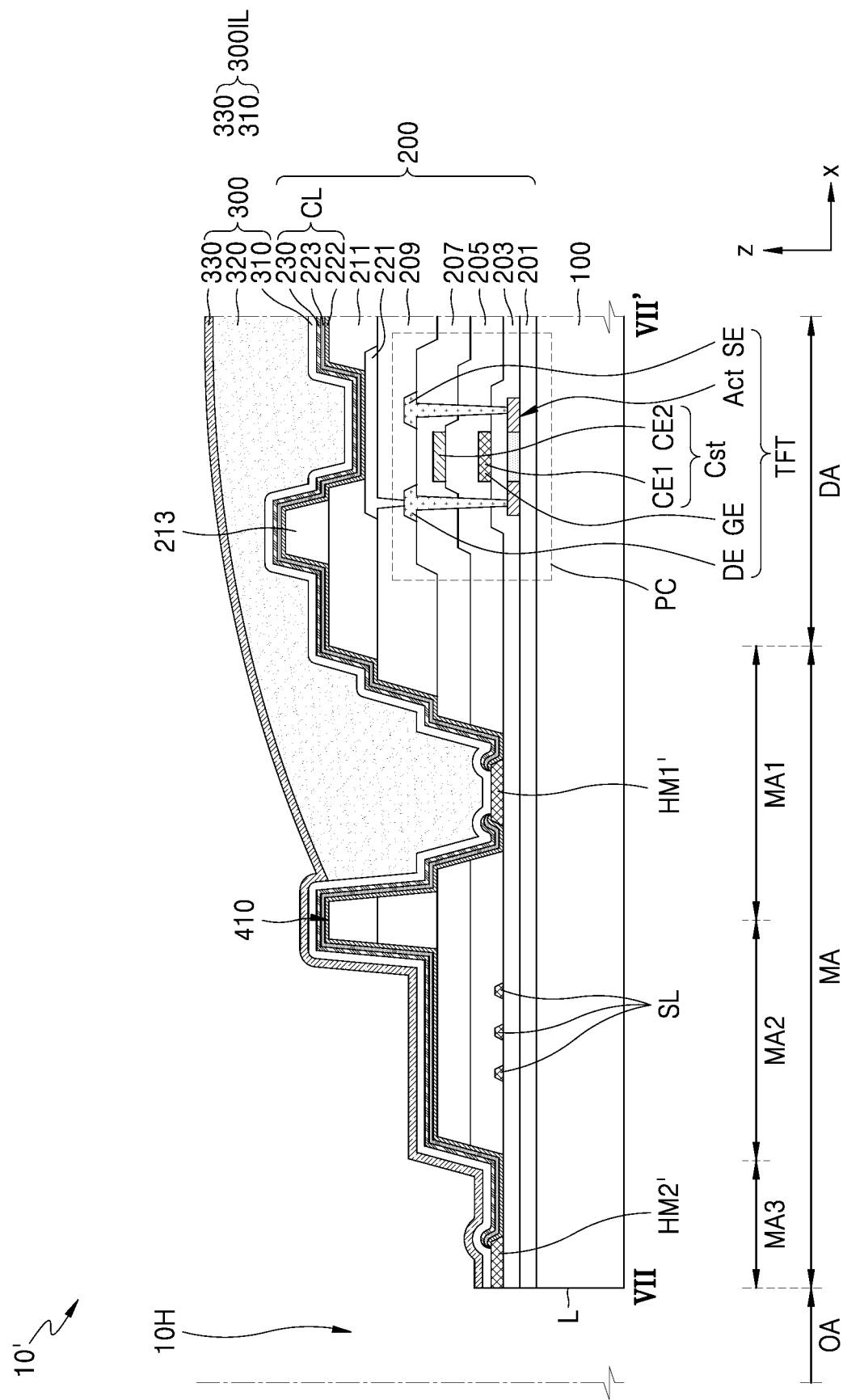
Figure 7C:
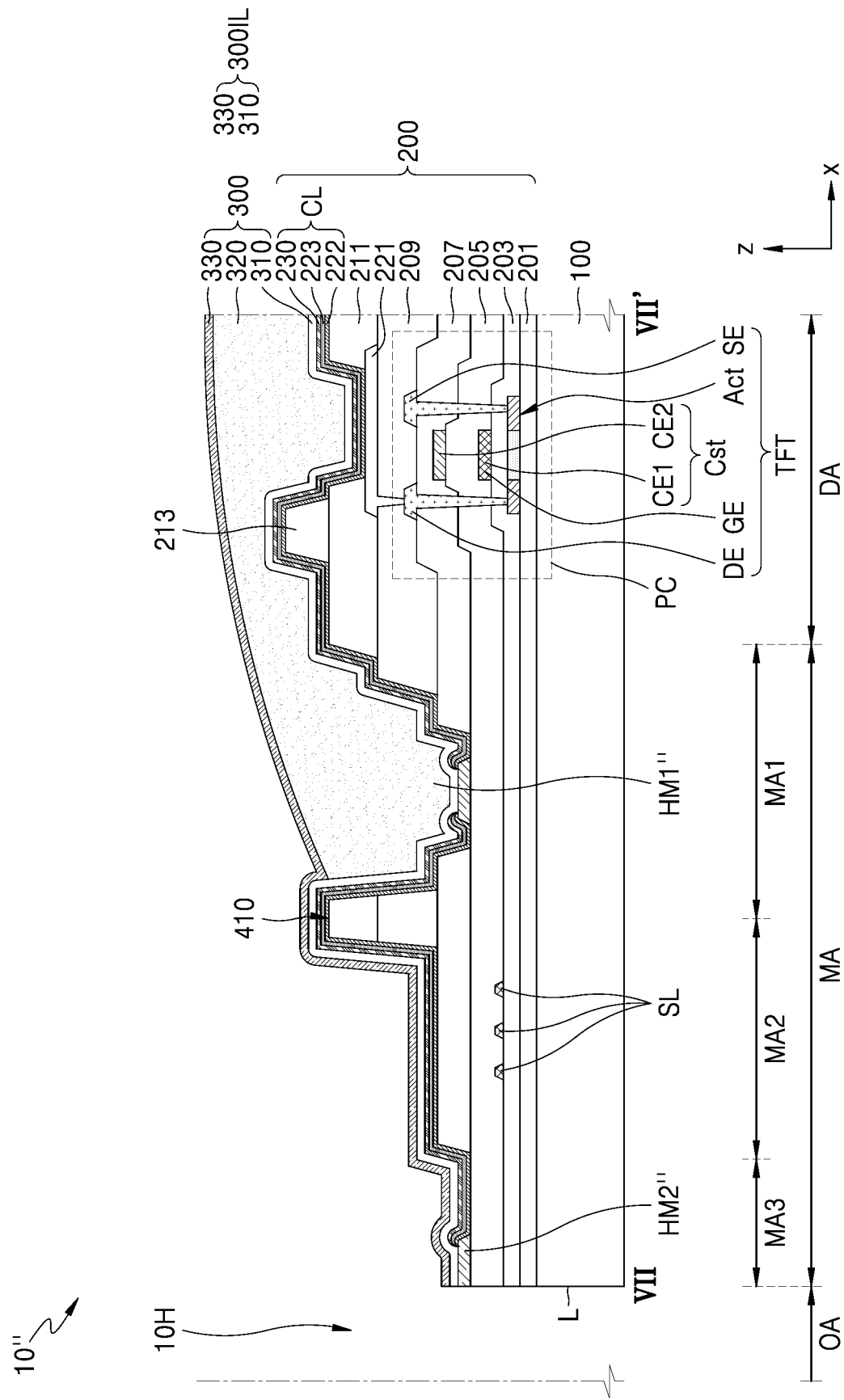

FIGS. 7A to 7C are examples of a cross-sectional view taken along line VII-VII' of the display panel of FIG. 6.

Referring to the display area DA of FIG. 7A, a substrate 100 may include a polymer resin. According to some example embodiments, the substrate 100 may include multiple layers as described above with reference to FIG. 3.

A buffer layer 201 configured to prevent impurities from permeating into a semiconductor layer Act of a thin film transistor TFT may be provided on the substrate 100. The buffer layer 201 may include an inorganic insulating material such as silicon nitride (SiNx), silicon oxynitride (SiON), and silicon oxide (SiOx) and may include a single layer or a multi-layer including the above-described inorganic insulating materials.

A pixel circuit PC may be arranged on the buffer layer 201. The pixel circuit PC includes the thin film transistor TFT and a storage capacitor Cst. The thin film transistor TFT may include the semiconductor layer Act, a gate electrode GE, a source electrode SE, and a drain electrode DE. The thin film transistor TFT shown in FIG. 7A may correspond to the driving thin film transistor described with reference to FIG. 5. Although the present embodiment shows a top-gate type thin film transistor in which the gate electrode GE is arranged over the semiconductor layer Act with a gate insulating layer 203 therebetween, the thin film transistor TFT may be a bottom-gate type thin film transistor according to some example embodiments.

The semiconductor layer Act may include polycrystalline silicon. Alternatively, the semiconductor layer Act may include amorphous silicon, an oxide semiconductor, or an organic semiconductor. The gate electrode GE may include a low resistance metal material. The gate electrode GE may include a conductive material including at least one of molybdenum (Mo), aluminum (Al), copper (Cu), and titanium (Ti) and may include a single layer or a multi-layer including the above materials.

The gate insulating layer 203 between the semiconductor layer Act and the gate electrode GE may include an inorganic insulating material such as silicon oxide, silicon nitride, and silicon oxynitride, aluminum oxide, titanium oxide, tantalum oxide, and hafnium oxide. The gate insulating layer 203 may include a single layer or a multi-layer including the above materials.

The source electrode SE and the drain electrode DE may include a material having excellent conductivity. The source electrode SE and the drain electrode DE may include a conductive material including at least one of Mo, Al, Cu, and Ti and may include a single layer or a multi-layer including the above materials. According to some example embodiments, the source electrode SE and the drain electrode DE may include a multi-layer of Ti/Al/Ti.

The storage capacitor Cst includes a lower electrode CE1 and an upper electrode CE2 that overlap each other with a first interlayer insulating layer 205 therebetween. The storage capacitor Cst may overlap the thin film transistor TFT. With regard to this, it is shown in FIG. 8 that the gate electrode GE of the thin film transistor TFT serves as the lower electrode CE1 of the storage capacitor Cst. According to some example embodiments, the storage capacitor Cst may not overlap the thin film transistor TFT. The storage capacitor Cst may be covered by a second interlayer insulating layer 207. The upper electrode CE2 may include a conductive material including at least one of Mo, Al, Cu, and Ti and may include a single layer or a multi-layer including the above materials.

The first and second interlayer insulating layers 205 and 207 may include an inorganic insulating material such as silicon oxide, silicon nitride, and silicon oxynitride, aluminum oxide, titanium oxide, tantalum oxide, and hafnium oxide. The first and second interlayer insulating layers 205 and 207 may include a single layer or a multi-layer including the above materials.

The pixel circuit PC including the thin film transistor TFT and the storage capacitor Cst may be covered by a planarization insulating layer 209. The planarization insulating layer 209 may include an approximately flat top surface. The planarization insulating layer 209 may include an organic insulating material including a general-purpose polymer such as polymethylmethacrylate (PMMA) and polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. According to some example embodiments, the planarization insulating layer 209 may include polyimide. Alternatively, the planarization insulating layer 209 may include an inorganic insulating material or inorganic and organic insulating materials.

A pixel electrode 221 may be formed on the planarization insulating layer 209. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflective layer including Ag, Mg, Al, Pt, Pd, Au, Ni, Nd, Ir, Cr, or a compound thereof. According to some example embodiments, the pixel electrode 221 may further include a layer including ITO, IZO, ZnO, or In$_2$O$_3$ on/under the reflective layer.

A pixel-defining layer 211 may be formed on the pixel electrode 221. The pixel-defining layer 211 may include an opening that exposes a top surface of the pixel electrode 221 and cover edges of the pixel electrode 221. The pixel-defining layer 211 may include an organic insulating material. Alternatively, the pixel-defining layer 211 may include an inorganic insulating material such as silicon nitride (SiNx), silicon oxynitride (SiON), and silicon oxide (SiOx). Alternatively, the pixel-defining layer 211 may include an organic insulating material and an inorganic insulating material.

An intermediate layer 222 includes an emission layer 222b. The intermediate layer 222 may include a first functional layer 222a arranged under the emission layer 222b and/or a second functional layer 222c arranged on the emission layer 222b. The emission layer 222b may include a polymer or low molecular weight organic material that emits light of a predetermined color.

The first functional layer 222a may include a single layer or a multi-layer. For example, in the case where the first functional layer 222a includes a polymer material, the first functional layer 222a includes a hole transport layer (HTL), which has a single-layered structure, and may include poly-(3,4)-ethylene-dihydroxy thiophene (PEDOT) or polyaniline (PANI). In the case where the first functional layer 222a includes a low molecular weight material, the first functional layer 222a may include a hole injection layer (HIL) and an HTL.

The second functional layer 222c may be omitted. For example, in the case where the first functional layer 222a and the emission layer 222b include a polymer material, the second functional layer 222c may be provided. The second functional layer 222c may include a single layer or a multi-layer. The second functional layer 222c may include an electron transport layer (ETL) and/or an electron injection layer (EIL).

The emission layer 222b of the intermediate layer 222 may be arranged every pixel in the display area DA. The emission layer 222b may contact a top surface of the pixel electrode 221 that is exposed through the opening of the pixel-defining layer 211. Unlike the emission layer 222b, the first and second functional layers 222a and 222c of the intermediate layer 222 may be not only in the display area DA but also in the intermediate area MA.

An opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or In$_2$O$_3$ on the (semi) transparent layer including the above-mentioned material. The opposite electrode 223 may be provided in not only the display area DA but also in the intermediate area MA. The intermediate layer 222 and the opposite electrode 223 may be formed by a thermal deposition method.

A capping layer 230 may be arranged on the opposite electrode 223. For example, the capping layer 230 may include LiF and may be formed by a thermal deposition method. The capping layer 230 may be omitted.

A spacer 213 may be provided on the pixel-defining layer 211. The spacer 213 may include an organic insulating material such as polyimide. Alternatively, the spacer 213 may include an inorganic insulating material such as silicon nitride or silicon oxide, or include an organic insulating material and an inorganic insulating material.

The spacer 213 may include a material different from that of the pixel-defining layer 211. Alternatively, the spacer 213 may include the same material as that of the pixel-defining layer 211. In this case, the pixel-defining layer 211 and the spacer 213 may be simultaneously formed during a mask process that uses a half-tone mask, etc. According to some example embodiments, the pixel-defining layer 211 and the spacer 213 may include polyimide.

An organic light-emitting diode OLED is covered by an encapsulation layer 300. The encapsulation layer 300 may include at least one organic encapsulation layer and at least one inorganic encapsulation layer 300IL, and it is shown in FIG. 7A that the encapsulation layer 300 includes first and second inorganic encapsulation layers 310 and 330, and an organic encapsulation layer 320 therebetween. According to some example embodiments, the number of organic encapsulation layers, the number of inorganic encapsulation layers, and a stacking sequence may be modified.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, or silicon oxynitride. The first and second inorganic encapsulation layers 310 and 330 may include a single layer or a multi-layer including the above materials. The organic encapsulation layer 320 may include a polymer-based material. The polymer-based material may include an acrylic-based resin, an epoxy-based resin, polyimide, and polyethylene. The thicknesses of the first and second inorganic encapsulation layers 310 and 330 may be different from each other. The thickness of the first inorganic encapsulation layer 310 may be greater than the thickness of the second inorganic encapsulation layer 330. For example, the thickness of the first inorganic encapsulation layer 310 may be about 1 μm, and the thickness of the second inorganic encapsulation layer 330 may be about 0.7 μm. Alternatively, the thickness of the second inorganic encapsulation layer 330 may be greater than the thickness of the first inorganic encapsulation layer 310, or the thicknesses of the first and second inorganic encapsulation layers 310 and 330 may be equal to each other.

Referring to the intermediate area MA of FIG. 7A, the at least one metal pattern HM1 and HM2 described above with reference to FIG. 6 is arranged in the intermediate area MA. In this case, if an area where the detour portions of the scan and data lines SL and DL shown in FIG. 6 are arranged is a second intermediate area MA2, an area at the side of the display area DA may be defined as a first intermediate area MA1 with the second intermediate area MA2 therebetween, and an area at the side of the opening area OA may be defined as a third intermediate area MA3 with the second intermediate area MA2 therebetween. Therefore, the first metal pattern HM1 may be arranged in the first intermediate area MA1, and the second metal pattern HM2 may be arranged in the third intermediate area MA3.

Because the cross-section of the display panel is taken along the line VII-VII' of FIG. 6, the scan line SL described with reference to FIG. 6 is shown in FIG. 7A as being arranged in the second intermediate area MA2. That is, when the display panel of FIG. 6 is cut along a line different from the line VII-VII', a data line (i.e., the data line DL in FIG. 6) and the scan line SL may be illustrated together in the second intermediate area MA2, or only a data line (i.e., the data line DL in FIG. 6) may be illustrated in the second intermediate area MA2.

Although it is shown in FIG. 7A that the scan line SL is formed on the same layer as the gate electrode GE of the thin film transistor TFT or the lower electrode CE1 of the storage capacitor Cst, the scan line may be formed on the same layer as the upper electrode CE2 of the storage capacitor Cst. According to some example embodiments, the data line (i.e., the data line DL in FIG. 6) may be formed on the same layer as the source electrode SE and the drain electrode DE of the thin film transistor TFT. In this case, the data line (i.e., the data line DL in FIG. 6) and the scan line SL may be arranged to be positioned in different layers.

According to the embodiment shown in FIG. 7A, both the first metal pattern HM1 and the second metal pattern HM2 may be arranged on the same layer as the source electrode SE and the drain electrode DE of the thin film transistor TFT. In this case, the first metal pattern HM1 and the second metal pattern HM2 may include the same material as the source electrode SE and the drain electrode DE, for example, a conductive material including at least one of Mo, Al, Cu, Ti, and the like. According to some example embodiments, the first metal pattern HM1 and the second metal pattern HM2 may have a multilayer structure of Ti/Al/Ti.

In the present embodiment, the pixel-defining layer 211 and the planarization insulating layer 209 on the first metal pattern HM1 may be removed or omitted, and thus, common layers CL such as a portion of the intermediate layer 222, the opposite electrode 223, and the capping layer 230 may be sequentially formed on the metal pattern HM1. For example, the portion of the intermediate layer 222 may include a first functional layer 222a and a second functional layer 222c.

The common layers CL may be formed overall to cover the display area DA and the intermediate area MA, and each of the common layers CL may be formed by thermal evaporation. In this case, an organic material, which is the material of the first and second functional layers 222a and 222c of the common layers CL, may provide a path through which moisture permeates. However, according to the embodiment, since the first and second functional layers 222a and 222c are cut off around at least a portion of each of the first metal pattern HM1 and the second metal pattern HM2 as shown in FIG. 7A, moisture may be prevented from permeating into the organic light-emitting diode OLED through the first functional layer 222a and/or the second functional layer 222c.

Specifically, the second metal pattern HM2 is a pattern that is closer to the opening area OA than the display area DA, and moisture permeation may be primarily blocked at the position of the second metal pattern HM2. For example, moisture that may permeate through a first opening 10H when the first opening 10H is formed with the edge of the opening area OA as a cutting line L is prevented from permeating into the intermediate area MA as the common layers CL are cut off around the second metal pattern HM2.

The first metal pattern HM1 is a pattern that is closer to the display area DA than the opening area OA, and moisture permeation may be secondarily blocked at the position of the first metal pattern HM1. For example, as the common layers CL are cut off around the first metal pattern HM1, moisture permeated in spite of the presence of the second metal pattern HM2 or moisture permeated through a path other than the first opening 10H is prevented from permeating into the display area A.

After the first and second functional layers 222a and 222c, the opposite electrode 223, and the capping layer 230 are formed, a first inorganic encapsulation layer 310 is formed. The first inorganic encapsulation layer 310 covers the disconnected portions of the common layers CL and extends to the opening area OA. That is, the first inorganic encapsulation layer 310 may be formed over substantially the entire surface of the substrate 100.

A barrier wall 410 is arranged between the first metal pattern HM1 and the second metal pattern HM2. The barrier wall 410 functions as a dam to prevent overflow of a monomer, which is a material for the formation of the organic encapsulation layer 320, toward the opening area OA, and thus, and an end portion of the organic encapsulation layer 320 is located adjacent to a wall surface of the barrier wall 410 at a side of the display area DA. That is, the organic encapsulation layer 320 may not be arranged in a region between the barrier wall 410 and the opening area OA.

A second inorganic encapsulation layer 330 is formed on the organic encapsulation layer 320. The second inorganic encapsulation layer 330 covers the disconnected portions of the common layers CL and extends to the opening area OA, like the first inorganic encapsulation layer 310. The second inorganic encapsulation layer 330 is also formed over substantially the entire surface of the substrate 100 to thereby prevent the permeation of moisture and foreign substances into the organic light-emitting diode OLED together with the first inorganic encapsulation layer 310.

As the encapsulation layer 300 is formed as described above, an encapsulation structure, in which the first inorganic encapsulation layer 310, the organic encapsulation layer 320, and the second inorganic encapsulation layer 330 are sequentially stacked, may be formed directly on the first metal pattern HM1. Therefore, a space between the first inorganic encapsulation layer 310 and the second inorganic encapsulation layer 330 above the first metal pattern HM1 is filled with the organic encapsulation layer 320, and the organic encapsulation layer 320 contacts the first encapsulation layer 310.

On the other hand, since the second metal pattern HM2 is not covered by the organic encapsulation layer 320, an encapsulation structure, in which the first inorganic encapsulation layer 310 and the second inorganic encapsulation layer 330 are sequentially stacked, may be formed directly on the second metal pattern HM2. Therefore, the second inorganic encapsulation layer 330 contacts the first inorganic encapsulation layer 310 on the second metal pattern HM2.

Embodiments shown in FIGS. 7B and 7C are substantially the same as the previous embodiment described with reference to FIG. 7A, except for the positions of the first metal pattern HM1 and the second metal pattern HM2. Therefore, the following descriptions focus on differences from the embodiment shown in FIG. 7A, and descriptions overlapping with those of the embodiment shown in FIG. 7A are abbreviated or omitted.

Also in a display panel 10' shown in FIG. 7B, the common layers CL such as the first and second functional layers 222a and 222c, the opposite electrode 223, and the capping layer 230 are cut off around each of the first metal pattern HM1' and the second metal pattern HM2', and thus, moisture may be prevented from permeating into the intermediate area MA and the display area DA through the first opening 10H.

In the present embodiment, each of the first metal pattern HM1' and the second metal pattern HM2' may be arranged on the same layer as the gate electrode GE of the thin film transistor TFT or the lower electrode CE1 of the storage capacitor Cst. In this case, the first metal pattern HM1' and the second metal pattern HM2' may be arranged on the same layer as the scan lines SL.

In this case, the first metal pattern HM1' and the second metal pattern HM2' may include a low resistance material which is the same material as the gate electrode GE. For example, the first metal pattern HM1' and the second metal pattern HM2' may include a conductive material including at least one of Mo, Al, Cu, and Ti and may include a single layer or a multi-layer including the above materials.

Also in a display panel 10" shown in FIG. 7C, the common layers CL such as the first and second functional layers 222a and 222c, the opposite electrode 223, and the capping layer 230 are cut off around each of the first metal pattern HM1" and the second metal pattern HM2", and thus, moisture may be prevented from permeating into the display area DA.

In the present embodiment, each of the first metal pattern HM1" and the second metal pattern HM2" may be arranged on the same layer as the upper electrode CE2 of the storage capacitor Cst. In this case, the first metal pattern HM1" and the second metal pattern HM2" may be arranged on the same layer as the data lines DL in FIG. 6 or the scan lines SL.

In this case, the first metal pattern HM1" and the second metal pattern HM2" may include the same material as the upper electrode CE2 of the capacitor Cst, for example, a conductive material including at least one of Mo, Al, Cu, and Ti, and may include a single layer or a multi-layer including the above materials.

Hereinafter, a manufacturing process of a display panel according to some example embodiments is described in detail with reference to FIGS. 8A to 8G.

FIGS. 8A to 8G are cross-sectional views sequentially illustrating a manufacturing process of a display panel according to some example embodiments.

Specifically, FIGS. 8A to 8G sequentially illustrate a process of forming upper layers of a second metal pattern HM2 on the second metal pattern HM2 shown in FIG. 6, and a portion of a display panel including an opening area OA and a third intermediate area MA3 (e.g., the third intermediate area MA3 in FIG. 7A and the like) surrounding the opening area OA is shown in FIGS. 8A to 8G for convenience of description. A cross-sectional view CSV of each of FIGS. 8A to 8G refers to a view defined in the xz plane as shown in FIG. 7a, and a plan view PV of each of FIGS. 8A to 8G refers to a view defined in the xy plane as shown in FIG. 6.

Figure 8A:
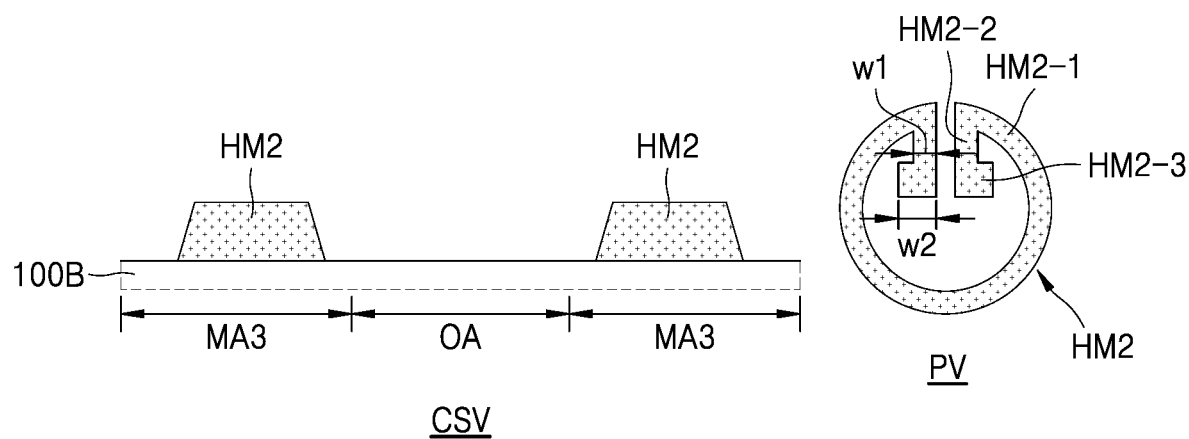
FIGS. 8A to 8G are cross-sectional views sequentially illustrating a manufacturing process of a display panel according to some example embodiments.

First, a base substrate 100B is prepared and a second metal pattern HM2 is formed on the base substrate 100B, as shown in the cross-sectional view CSV of FIG. 8A. The base substrate 100B refers to the substrate 100 in a state where the buffer layer 201, the gate insulating layer 203, the first interlayer insulating layer 205, and the second interlayer insulating layer 207 described with reference to FIG. 7A are stacked.

According to some example embodiments, the second metal pattern HM2 may be formed on the same layer as the source electrode SE in FIG. 7A or the like and the drain electrode DE in FIG. 7A or the like of the thin film transistor TFT in FIG. 7A or the like and may include the same material as the source electrode SE in FIG. 7A or the like and the drain electrode DE in FIG. 7A or the like.

At this stage, the second metal pattern HM2 may have the same shape as the first metal pattern HM1 shown in FIG. 6. Referring to the plan view PV of FIG. 8A, the second metal pattern HM2 may have a ring shape that surrounds the opening area OA and is open at one side, and may include a first portion HM2-1, a second portion HM2-2, and a third portion HM2-3.

The first portion HM2-1 is a curved portion having a ring shape surrounding the opening area OA and may remain as it is without cutting in a subsequent process. The second portion HM2-2 is a portion extending from the first portion HM2-1 and bent toward the opening area OA, and the third portion HM2-3 is a portion extending from the second portion HM2-2 and corresponds to an end portion of the second metal pattern HM2 in the present stage. In this case, a length w2 of the third portion HM2-3 corresponding to a width w1 of the second portion HM2-2 may be greater than the width w1 of the second portion HM2-2. The third portion HM2-3 may have a greater size or a greater area than the second portion HM2-2.

Figure 8B:
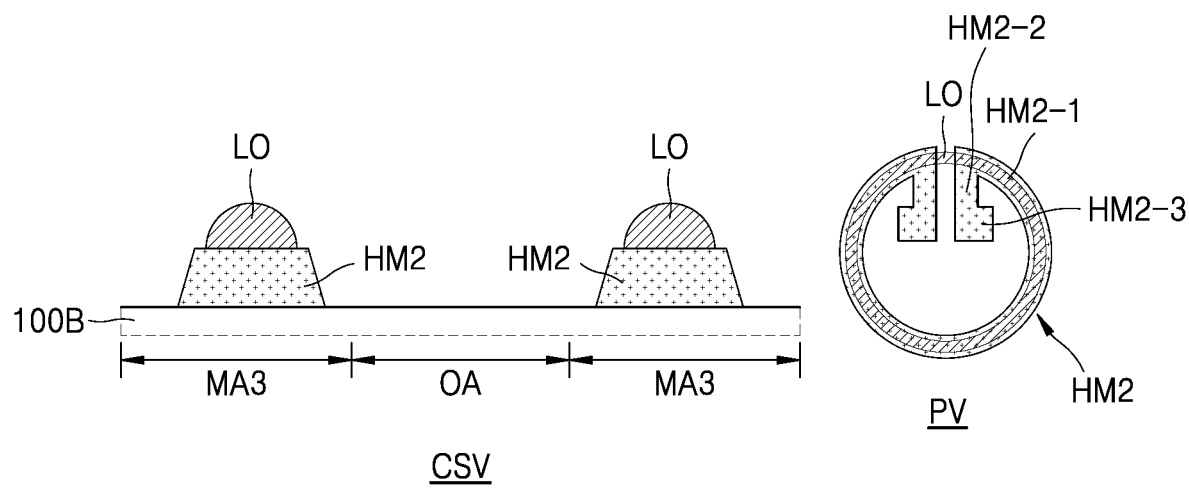

Next, a lift-off pattern LO is formed on the second metal pattern HM2, as shown in the cross-sectional view CSV of FIG. 8B. The lift-off pattern LO is separated from the second metal pattern HM2 in a subsequent process, and although it is shown in the cross-sectional view CSV of FIG. 8B that the lift-off pattern LO is formed narrower than the upper surface of the second metal pattern HM2, the present disclosure is not limited thereto. That is, the lift-off pattern LO may be formed to cover at least the entire upper surface of the second metal pattern HM2.

Referring to the plan view PV of FIG. 8B, the lift-off pattern LO may be formed in a shape corresponding to the first portion HM2-1 of the second metal pattern HM2 and may have a ring shape in the form of a closed curve without one side being opened unlike the second metal pattern HM2.

According to some example embodiments, the lift-off pattern LO may include a material having a negative thermal expansion coefficient, for example, polyolefin, acrylic polymer, polyester, or a combination of at least one of them.

According to some example embodiments, a detachable layer may be further arranged between the lift-off pattern LO and the second metal pattern HM2. The detachable layer may function to facilitate separation, and the material, size, and the like of the detachable layer may be variously changed according to physical properties and other process conditions of each of the lift-off pattern LO and the second metal pattern HM2.

This operation is performed before the intermediate layer 222 of the organic light-emitting diode OLED in FIG. 7A (for example, the first and second functional layers 222a and 222c in FIG. 7A) is formed, and according to some example embodiments, the operation may be performed immediately after the pixel-defining layer 211 in FIG. 7A is formed.

Figure 8C:
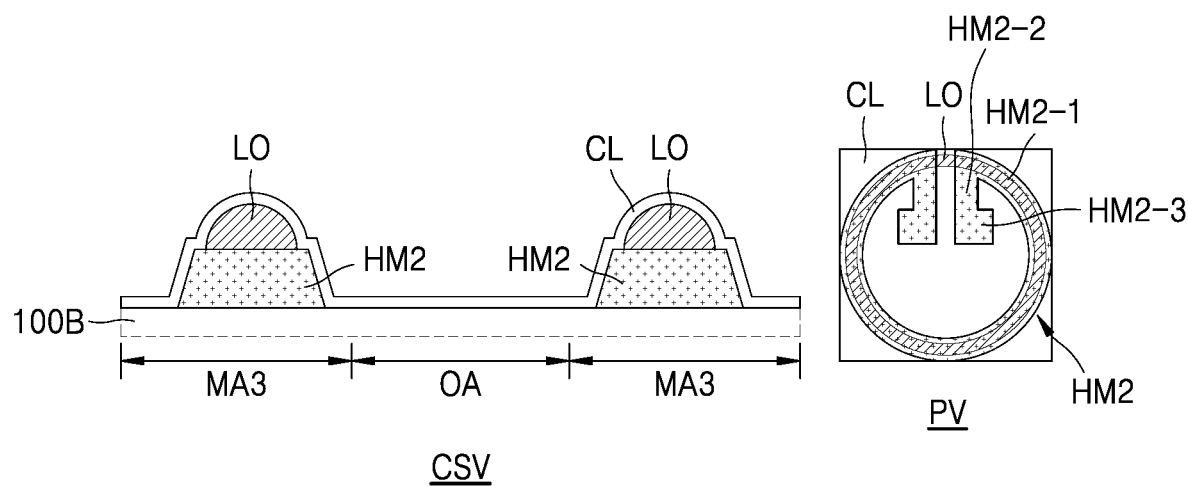

Next, a common layer CL is formed on the lift-off pattern LO, as shown in the cross-sectional view CSV of FIG. 8C. The common layer CL may include a portion of the intermediate layer 222 in FIG. 7A (for example, the first and second functional layers 222a and 222c in FIG. 7A), the opposite electrode 223 in FIG. 7A, the capping layer 230 in FIG. 7A, and the like.

The common layer CL may be formed over substantially the entire surface of the base substrate 100B. Therefore, the second metal pattern HM2 and the lift-off pattern LO in the plan view PV of FIG. 8C are covered by the common layer CL.

Figure 8D:
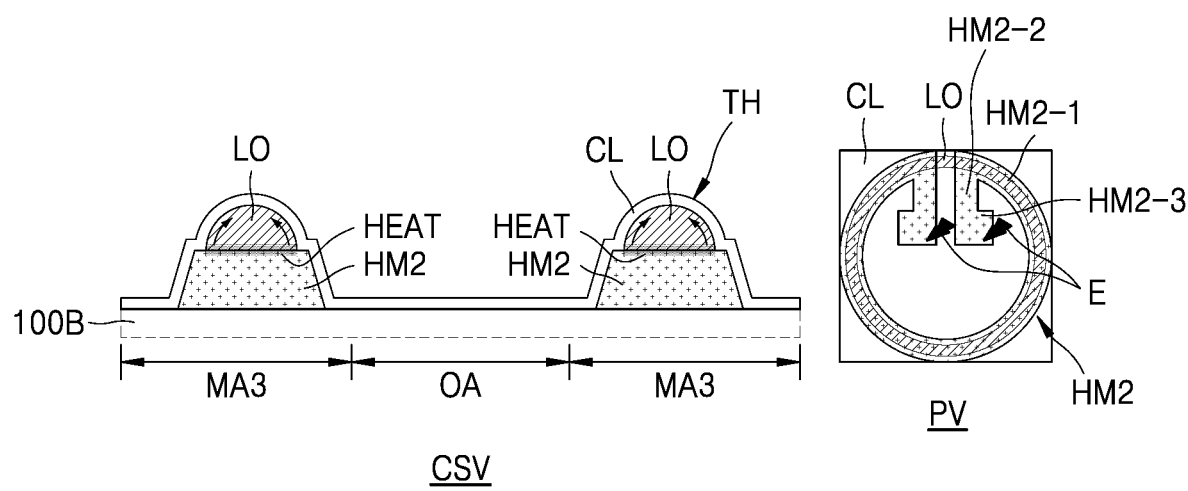

Next, an external power E is supplied to the second metal pattern HM2 which is a lower layer of the lift-off pattern LO, as shown in the cross-sectional view CSV and the plan view PV of FIG. 8D.

At this stage, the external power E may be supplied to the second metal pattern HM2 in various ways. According to some example embodiments, a method of forming a hole in a portion TH of the common layer CL immediately above the lift-off pattern LO and bringing a probe having a sharp shape into contact with the second metal pattern HM2 may be used. In this case, the probe may be in contact with the third portion HM2-3 of the second metal pattern HM2. To this end, the width, size, or area of the third portion HM2-3 of the second metal pattern HM2 may be greater than those of the second portion HM2-2 so that current may flow rapidly to the second portion HM2-2 and the first portion HM2-1.

However, the method of supplying the external power E is not limited thereto. According to some example embodiments, a method of forming a contact hole in at least a portion of the base substrate 100B and bring the second metal pattern HM2 into contact with an external power source through the contact hole may be used.

As a result, as shown in the cross-sectional view CSV of FIG. 8D, a current is applied to the second metal pattern HM2 and thus heat HEAT is generated at the interface between the second metal pattern HM2 and the lift-off pattern LO. The heat HEAT may be Joul heat generated by current flow in a conductor.

As described with reference to FIG. 8B, the lift-off pattern LO may have a negative thermal expansion coefficient. As a result, when heat is generated in the second metal pattern HM2 and the temperature of the lift-off pattern LO increases, a shrinkage stress is generated in the lift-off pattern LO substantially in the direction of the arrow shown in the lift-off pattern LO.

Figure 8E:
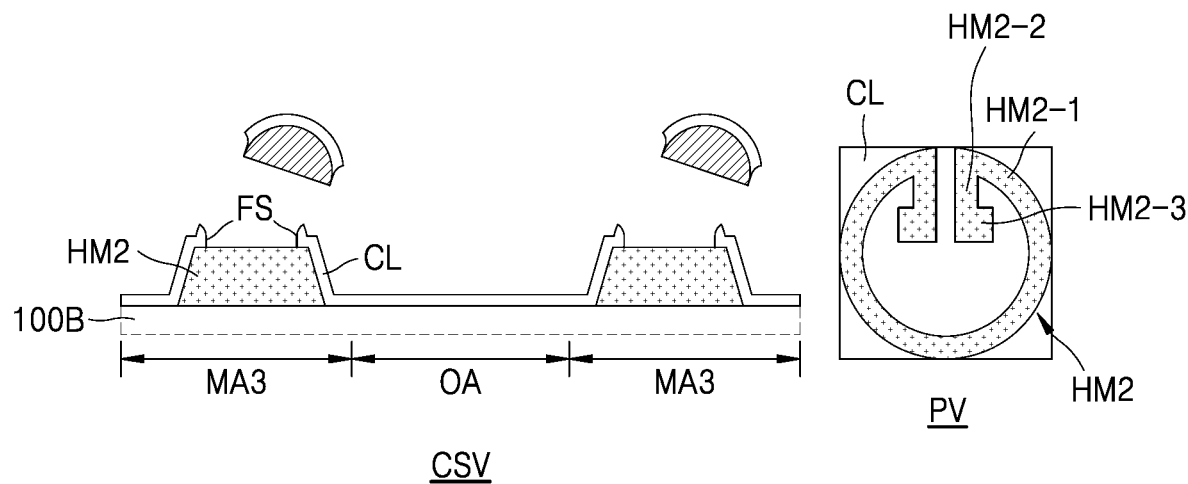

Then, as shown in the cross-sectional view CSV and the plan view PV of FIG. 8E, the lift-off pattern LO may be separated from the second metal pattern HM2 due to shrinkage stress caused by heat shrinkage. In this case, a portion of the common layer CL located over the lift-off pattern LO may be broken and separated from the second metal pattern HM2 together with the lift-off pattern LO. As a result, the remaining portion of the common layer CL may remain on the surface of the second metal pattern HM2 and the common layer CL may be cut off around at least a portion of the surface of the second metal pattern HM2 (for example, the upper surface of the second metal pattern HM2).

At this stage, both cut-off ends of the common layer CL may have broken surfaces FS having irregular roughness.

Figure 8F:
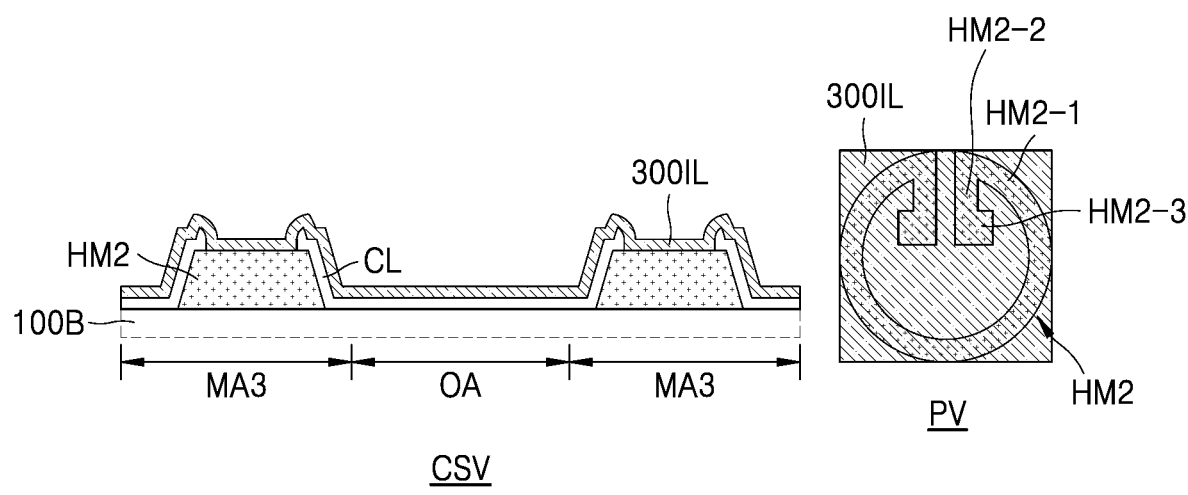

An encapsulation layer is then formed to cover substantially the entire surface of the base substrate 100B, as shown in the cross-sectional view CSV and the plan view PV of FIG. 8F. The encapsulation layer may include the first inorganic encapsulation layer 310, the organic encapsulation layer 320, and the second inorganic encapsulation layer 330 described above with reference to FIG. 7A. However, since only the opening area OA and the third intermediate area MA3 adjacent to the opening area OA are shown in FIG. 8F, the encapsulation layer formed on the base substrate 100B may include a stack structure 300IL including the first inorganic encapsulation layer 310 in FIG. 7A and the third inorganic encapsulation layer 330 in FIG. 7A.

Figure 8G:
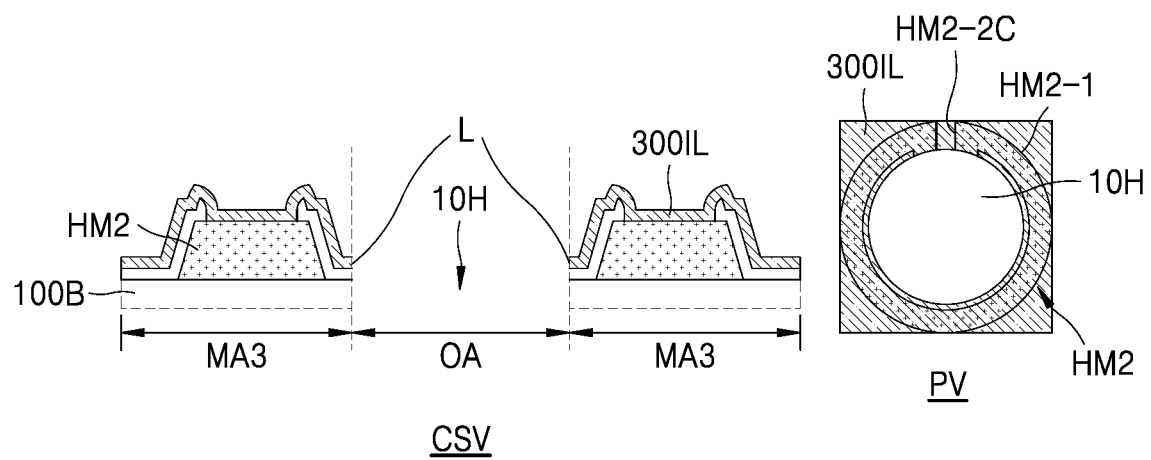

The base substrate 100B and layers on the base substrate 100B are then cut along a cutting line L corresponding to the edge of the opening area OA, as shown in the cross-sectional view CSV and the plan view PV of FIG. 8G. As a result, a first opening 10H is formed in the opening area OA, and since the common layer CL is cut off around at least a portion of the surface of the second metal pattern HM2, moisture hardly penetrates through the first opening 10H.

As described above, as the opening area OA is cut, portions of the third portion HM2-3 (see FIG. 8F) and the second portion HM2-2 (see FIG. 8F) of the second metal pattern HM2 may be also removed. As a result, the second metal pattern HM2 has the first portion HM2-1 and a cut second portion HM2-2C, as shown in FIG. 8G.

The first metal pattern HM1 described with reference to FIG. 6 may also be formed through processes similar to those shown in FIGS. 8A to 8G. However, in the case of the first metal pattern HM1 in FIG. 6, even if the opening area OA is cut as shown in FIG. 8G, the first portion HM1-1 in FIG. 6, the second portion HM1-2 in FIG. 6, and the third portion HM1-3 in FIG. 6 remain as they are.

Figure 9:
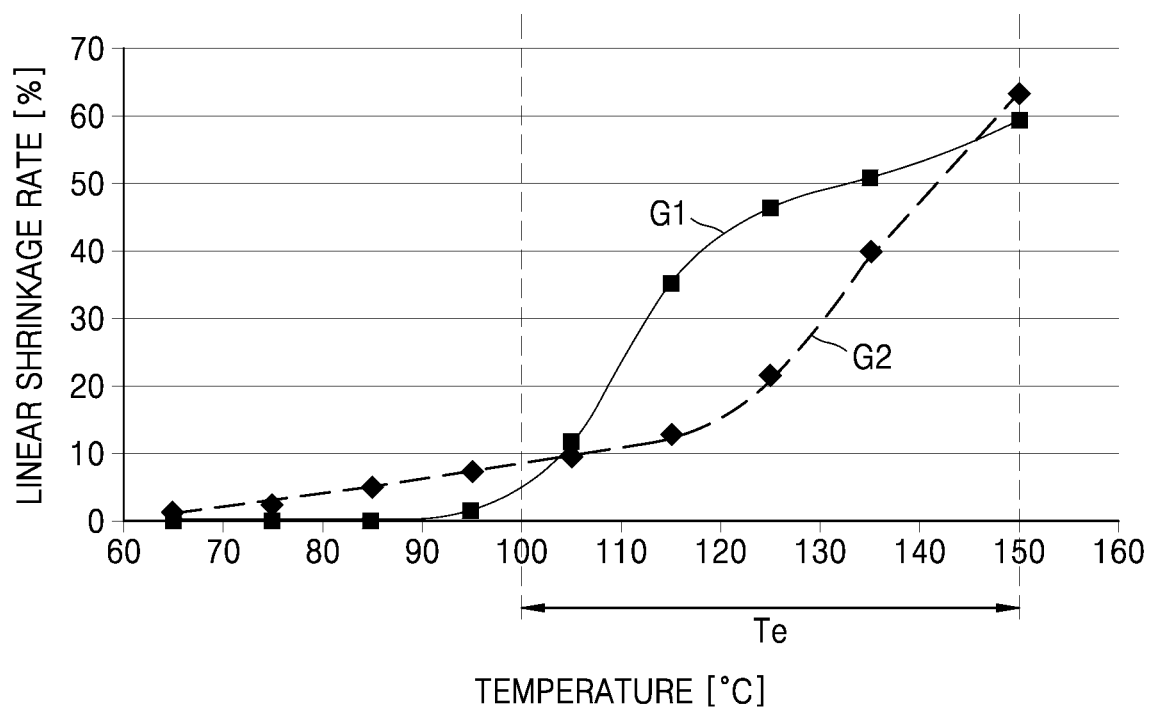
FIG. 9 is a graph showing the physical properties of a material for the formation of the lift-off pattern LO in FIG. 8B.

FIG. 9 is a graph showing the physical properties of a material for the formation of the lift-off pattern LO in FIG. 8B.

Referring to FIG. 9, the x-axis of the graph represents a temperature change of the material for formating the lift-off pattern LO, and the y-axis of the graph represents a linear shrinkage rate of the material for formating the lift-off pattern LO.

The first line G1 shows a change in the physical properties of polyolefin which is one of materials for the formation of the lift-off pattern LO, and the second line G2 shows a change in the physical properties of acrylic polymer which is one of the materials for the formation of the lift-off pattern LO.

Due the first line G1 and the second line G2, a change in the linear shrinkage rate is relatively large when the temperature of the material for forming the lift-off pattern LO ranges from about 100° C. to about 150° C., and thus, a temperature in the range of about 100° C. to about 150° C. may be regarded as an effective temperature Te at which the lift-off pattern LO may be largely affected by shrinkage stress.

When such physical property data is applied to the process shown in FIG. 8D, the lift-off pattern LO may be easily separated when the second metal pattern HM2 is heated at a temperature of about 100° C. to about 150° C. Therefore, by adjusting the amount of current applied to the first and second metal patterns HM1 and HM2 shown in FIG. 6 such that the first and second metal patterns HM1 and HM2 are heated at a temperature of about 100° C. to about 150° C., a cutting operation of the common layer CL in FIG. 8D may be effectively performed.

As described above, the display panel according to some example embodiments may prevent or reduce instances of foreign substances such as moisture penetrating to the side surface of an opening formed in a display device and damaging display elements surrounding the opening.

However, the scope of the present disclosure is not limited by this effect.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:
1. A display panel comprising:
   a substrate including an opening area, a display area surrounding the opening area, and an intermediate area between the opening area and the display area;
   a plurality of display elements in the display area, each of the plurality of display elements being electrically connected to a thin film transistor;

a plurality of wirings arranged along an edge of the opening area in the intermediate area; and at least one metal pattern spaced apart from the plurality of wirings in the intermediate area, the at least one metal pattern surrounding the opening area and having a ring shape opened at one side in a plan view.

2. The display panel of claim 1, wherein the at least one metal pattern comprises:

a first portion surrounding the opening area;

a second portion extending from the first portion and bent toward the opening area; and a third portion extending from the second portion, the third portion having a length corresponding to a width of the second portion, the length being greater than the width of the second portion.

3. The display panel of claim 1, wherein the at least one metal pattern comprises:

a first portion surrounding the opening area; and a second portion extending from the first portion and bent toward the opening area, wherein the second portion extends to an edge of a hole corresponding to the opening area.

4. The display panel of claim 1, wherein the at least one metal pattern is arranged on a same layer as a source electrode and a drain electrode of the thin film transistor.

5. The display panel of claim 1, wherein the at least one metal pattern is arranged on a same layer as a gate electrode of the thin film transistor.

6. The display panel of claim 1, further comprising:

a capacitor having a lower electrode arranged on a same layer as a gate electrode of the thin film transistor and an upper electrode at least partially overlapping the gate electrode, wherein the at least one metal pattern is arranged on a same layer as the upper electrode of the capacitor.

7. The display panel of claim 1, wherein each of the plurality of display elements comprises:

a pixel electrode electrically connected to at least one of a source electrode and a drain electrode of the thin film transistor;

an opposite electrode on the pixel electrode; and an emission layer between the pixel electrode and the opposite electrode.

8. The display panel of claim 7, further comprising:

a functional layer between the pixel electrode and the emission layer, between the emission layer and the opposite electrode, or between the pixel electrode and the emission layer and between the emission layer and the opposite electrode, wherein each of the functional layer and the opposite electrode is cut off around at least a portion of a surface of the at least one metal pattern.

9. The display panel of claim 1, further comprising:

an encapsulation layer covering the plurality of display elements, the encapsulation layer including a first inorganic encapsulation layer, a second inorganic encapsulation layer, and an organic encapsulation layer between the first inorganic encapsulation layer and the second inorganic encapsulation layer.

10. The display panel of claim 9, wherein the at least one metal pattern comprises:

a first metal pattern arranged closer to the display area than to the opening area; and a second metal pattern between the first metal pattern and the opening area, wherein the first inorganic encapsulation layer and the organic encapsulation layer are in contact with each other on the first metal pattern, and the first inorganic encapsulation layer and the second inorganic encapsulation layer are in contact with each other on the second metal pattern.

11. A method of manufacturing a display panel, the method comprising:

forming at least one metal pattern in an intermediate area of a substrate, the substrate including:

an opening area;

a display area surrounding the opening area; and the intermediate area between the opening area and the display area, the at least one metal pattern surrounding the opening area and having a ring shape opened at one side;

forming a pixel electrode in the display area;

forming a lift-off pattern on the at least one metal pattern, the lift-off pattern being in contact with the at least one metal pattern and having a negative thermal expansion coefficient;

sequentially forming an emission layer and an opposite electrode to cover the pixel electrode and the lift-off pattern; and separating portions of the emission layer and the opposite electrode from the substrate together with the lift-off pattern by applying current to both ends of the at least one metal pattern and heating the at least one metal pattern.

12. The method of claim 11, further comprising:

forming a thin film transistor electrically connected to the pixel electrode in the display area.

13. The method of claim 12, wherein the at least one metal pattern is arranged on a same layer as a source electrode and a drain electrode of the thin film transistor.

14. The method of claim 12, wherein the at least one metal pattern is arranged on a same layer as a gate electrode of the thin film transistor.

15. The method of claim 12, further comprising:

forming a capacitor having a lower electrode arranged on a same layer as a gate electrode of the thin film transistor and an upper electrode at least partially overlapping the gate electrode, wherein the at least one metal pattern is arranged on a same layer as the upper electrode of the capacitor.

16. The method of claim 11, wherein the lift-off pattern comprises at least one of polyolefin, acryl-based polymer, and polyester.

17. The method of claim 11, wherein the separating of the portions of the emission layer and the opposite electrode comprises:

heating the at least one metal pattern at a temperature of about 100° C. to about 150° C.

18. The method of claim 11, further comprising:

forming an encapsulation layer on the opposite electrode, the encapsulation layer including a first inorganic encapsulation layer, a second inorganic encapsulation layer, and an organic encapsulation layer between the first inorganic encapsulation layer and the second inorganic encapsulation layer.

19. The method of claim 18, wherein the forming of the at least one metal pattern comprises:

forming a first metal pattern closer to the display area than to the opening area; and forming a second metal pattern of which at least a portion is between the first metal pattern and the opening area, wherein the first inorganic encapsulation layer and the organic encapsulation layer are in contact with each other on the first metal pattern, and the first inorganic encapsulation layer and the second inorganic encapsulation layer are in contact with each other on the second metal pattern.

20. The method of claim 19, further comprising:

forming a hole corresponding to the opening area, wherein an end portion of the second metal pattern is cut along an edge of the hole.

\* \* \* \* \*